United States Patent [19]

Herrmann et al.

[11] Patent Number: 5,034,700

[45] Date of Patent: Jul. 23, 1991

[54] INTEGRATABLE AMPLIFIER CIRCUIT

[75] Inventors: Helmut Herrmann, München; Rudolf Koch, Unterhaching, both of Fed. Rep. of Germany

[73] Assignee: Siemens Aktiengesellschaft, Munich, Fed. Rep. of Germany

[21] Appl. No.: 500,717

[22] Filed: Mar. 28, 1990

[30] Foreign Application Priority Data

Mar. 19, 1989 [EP] European Pat. Off. ............ 89105563

[51] Int. Cl.$^5$ .............................................. H03F 3/45
[52] U.S. Cl. ................................ 330/253; 330/255; 330/259
[58] Field of Search ............... 330/253, 255, 259, 267, 330/268, 273, 274

[56] References Cited

U.S. PATENT DOCUMENTS

| | | | |
|---|---|---|---|
| 4,320,347 | 3/1982 | Haque | 330/9 |
| 4,458,213 | 7/1984 | Quan | 330/267 |
| 4,476,441 | 10/1984 | Gulczynski | 330/267 X |
| 4,897,616 | 1/1990 | Wang et al. | 330/267 X |

FOREIGN PATENT DOCUMENTS

| | | |
|---|---|---|
| 0143375 | 6/1985 | European Pat. Off. . |
| 0297639 | 1/1989 | European Pat. Off. . |

OTHER PUBLICATIONS

IEEE Journal of Solid-State Circuits, vol. SC-18, No. 1, Feb. 1983, pp. 121-127, IEEE, New York, U.S.; V. R. Saari: "Low-Power High-Drive CMOS Operational Amplifiers".

IEEE Journal of Solid-State Circuits, vol. SC-18, No. 6, Dec. 1983, pp. 624-629, IEEE, New York, U.S., K. E. Brehmer et al.: "Large Swing CMOS Power Amplifier".

Primary Examiner—James B. Mullins
Attorney, Agent, or Firm—Herbert L. Lerner; Laurence A. Greenberg

[57] ABSTRACT

An integratable amplifier circuit includes a preamplifier stage, a drive stage, a push-pull end stage, and a regulating stage forming a differential value from a reference current and from a measurement current proportional to the static current flowing through the push-pull end stage. The regulating stage stores the diferential value or a value proportional thereto upon the occurrence of a control signal at a control input indicating the non-level control of the preamplifier stage and sets the static current of the push-pull end stage by varying the operating point of the push-pull end stage as a function of the stored value.

9 Claims, 1 Drawing Sheet

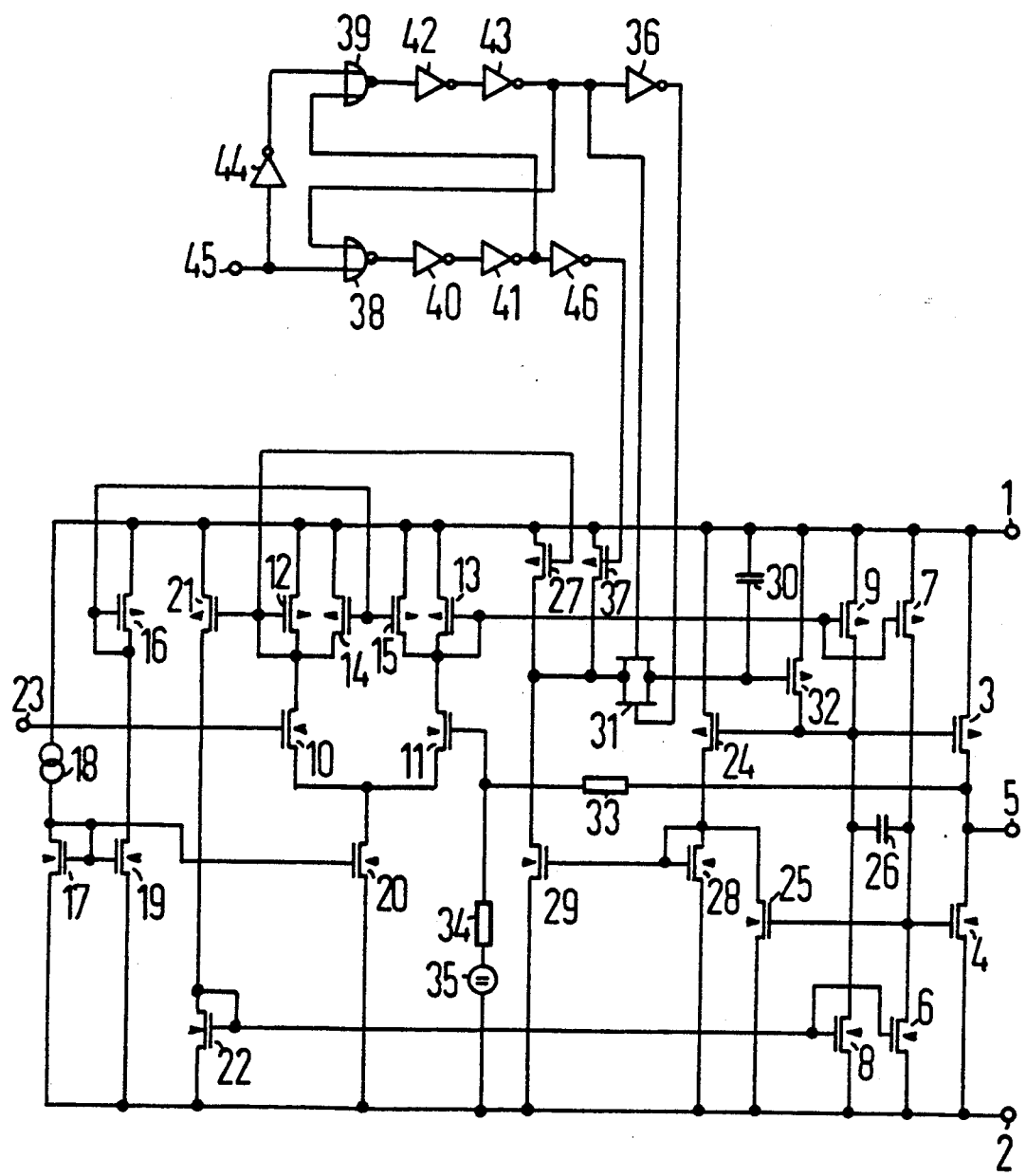

INTEGRATABLE AMPLIFIER CIRCUIT

The invention relates to an integratable amplifier circuit having a preamplifier stage, a drive stage and a push-pull end stage.

CMOS operational amplifiers, in particular, are usually constructed for the most part with current mirrors because that assures low sensitivity of the circuit to parameter fluctuations. Similar concepts also apply for power amplifiers which, for instance, are used as power drivers in telecommunications components. However, with such circuits it is difficult to simultaneously attain a high range below the point where overload begins, a high current yield and a large bandwidth.

A circuit that is better equipped to meet such demands was introduced by K. J. Stern et al, in "A Monolithic Line Interface Circuit For T1 Terminals", IEEE Digest, International Solid-State Circuits Conference, February, 1987. The output transducers in that case are not triggered through current mirrors but rather with the output voltage of inverters. That enables a substantially greater level control of the output transistors. They can even be operated in the triode range. The disadvantage of the device is that the static current of the output stage scatters very markedly (up to 50% of the peak current) if there is no additional control circuit. In the known circuit, transistors operated as diodes are proposed to limit the static current. Through the use of switches, these transistors are activated and the static current is set whenever no input signal is present or in other words whenever only the static current is supposed to flow in the output path. However, due to the low amplification of the transistors that are operated as diodes, which is approximately 1, considerable scattering of the static current must be expected with such a simple control circuit.

It is accordingly an object of the invention to provide an integratable amplifier circuit, which overcomes the hereinafore-mentioned disadvantages of the heretofore-known devices of this general type and in which less scattering of the static current occurs.

With the foregoing and other objects in view there is provided, in accordance with the invention, an integratable amplifier circuit, comprising a preamplifier stage, a drive stage, a push-pull end stage, and a regulating stage forming a differential value from a reference current and from a measurement current proportional to the static current flowing through the push-pull end stage, storing the differential value or a value proportional thereto upon the occurrence of a control signal at a control input indicating the non-level control of the preamplifier stage and setting the static current of the push-pull end stage by varying the operating point of the push-pull end stage as a function of the stored value.

In accordance with another feature of the invention, the preamplifier stage has an input, the push-pull end stage has an output and two branches, and the regulating stage sets the static current only of one of the branches, and there is provided a negative feedback network connected between the output of the push-pull end stage and the input of the preamplifier stage for setting the static current of the other of the branches.

In accordance with a further feature of the invention, the reference current is dependent on a signal present at the input of the preamplifier stage.

In accordance with an added feature of the invention, the preamplifier stage is an operational transconductance amplifier.

In accordance with an additional feature of the invention, the reference current is generated from the output current of the operational transconductance amplifier.

In accordance with yet another feature of the invention, the regulating stage is a sample and hold circuit for storing the differential value or the value proportional thereto.

In accordance with yet a further feature of the invention, the push-pull end stage has push-pull inputs, and there is provided a capacitor connected between the push-pull inputs.

In accordance with yet an added feature of the invention, the push-pull end stage has two push-pull inputs, and there is provided a first transistor having a drain lead connected to one of the two push-pull inputs of the push-pull end stage, a source lead connected to a first operating potential, and a gate lead, a storage capacitor connected between the gate and source leads of the first transistor, a push-pull stage having push-pull inputs connected parallel to the push-pull inputs of the push-pull end stage and having an output, a current mirror being referred to a second operating potential and having an input connected to the output of the push-pull stage and an output, a control input, a transmission gate having a drain-to-source path connected between the output of the current mirror and the gate lead of the first transistor and the transmission gate having gate leads being coupled in phase opposition to one another to the control input, and a second transistor having a source lead connected to the first operating potential and a drain lead connected to the output of the current mirror, as a regulating stage.

In accordance with yet an additional feature of the invention there is provided a third transistor having a drain-to-source path connected parallel to the drain-to-source path of the second transistor and having a gate lead coupled to the control lead.

In accordance with a concomitant feature of the invention, there is provided a control stage coupling the gate leads of the transmission gate and the gate lead of the third transistor to the control input, for preventing overlapping switching pulse edges during triggering of the transmission gate and the third transistor.

An advantage of the invention is that by using a control loop, the fluctuations of the static current in the output stage can be kept quite low, at little expense.

Other features which are considered as characteristic for the invention are set forth in the appended claims.

Although the invention is illustrated and described herein as embodied in an integratable amplifier circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

The drawing is a schematic circuit diagram of an embodiment of the amplifier circuit according to the invention.

Referring now in detail to the single figure of the drawing, there is seen a push-pull end stage with a PMOS transistor 3, which is connected on the source side to a positive first operating potential 1, and an NMOS transistor 4, which is connected on the source side to a negative second operating potential 21. The drain leads of the transistors 3, 4 are joined and form the output 5 of the amplifier circuit. The gate leads of the transistors 3, 4 are each connected to the output of a respective push-pull stage. The two push-pull stages together form a driver stage for the push-pull end stage and each has a respective PMOS transistor 7 or 9 and a respective NMOS transistor 6 or 8. The source leads of the transistor 7 and 9 are acted upon by the first operating potential 1, and the source leads of the transistor 6 and 8 are acted upon by the second operating potential 2. The drain leads of the transistors 6 and 7 are interconnected and joined to the gate lead of the transistor 4. Similarly, the drain leads of the transistors 8 and 9 are joined and connected to the gate lead of the transistor 3.

According to a feature of the invention, an operational transconductance amplifier which is provided as the preamplifier stage, is preferentially used because of its speed and the ability to dissipate currents without entailing great expense. This amplifier has two source-coupled NMOS transistors 10 and 11, in the drain circuits of which respective transistors 12 and 13 are provided. The transistors 12, 13 are operated as diodes in the forward direction, in each case by joining the drain and source leads. The drain-to-source paths of the transistors 12, 13 are respectively connected in parallel with the respective drain-to-source paths of transistors 14, 15. The transistors 14 and 15 have joined gate leads which are firstly connected to the first operating potential 1 through a PMOS transistor 16 which is operated as a diode in the forward direction by joining the drain and gate leads thereof, and the joined gate leads are secondly connected to a first current mirror referred to the second operating potential 2. The first current mirror has an NMOS transistor 17, which is operated as a diode in the forward direction by joining the drain and gate leads thereof and which is connected both to a current source 18 connected to the first operating potential 1 and to a transistor 19. The gate lead of the transistor 19 is in turn connected to the gate lead of the transistor 17 and its drain lead is connected to the drain lead of the transistor 16. The gate lead of an NMOS transistor 20 is also connected to the gate lead of the transistor 17, and the drain lead of the transistor 20 is connected to the coupled source leads of the transistors 10 and 11, while the source lead of the transistor 20, like the source leads of the transistors 17 and 19, is connected to the second operating potential 2.

The coupling of the driver stage to the preamplifier stage is carried out firstly through a direct connection between the drain lead of the transistor 11 and the gate leads of the transistors 7 and 9, and secondly by means of a PMOS transistor 21. The gate lead of the PMOS transistor 21 is connected to the drain lead of the transistor 10 and the drain lead of the transistor 21 is connected to the gate leads of the transistors 6 and 8. Moreover, the gate leads of the transistors 6 and 8 are connected to the second operating potential 2 through an NMOS transistor 22, which is operated as a diode in the forward direction by joining the gate and drain leads thereof. Like the source leads of the transistors 12, 13, 14 and 15, the source lead of the transistor 21 is acted upon by the first operating potential 1. The gate lead of the transistor 10 is provided as a non-inverting input 23 of the amplifier circuit, and the gate lead of the transistor 11 is provided as an inverting input.

According to the invention, the amplifier circuit shown in the drawing includes a regulating stage. The regulating stage may, for instance, include a further push-pull stage having a PMOS transistor 24 and an NMOS transistor 25, which are connected in parallel with the push-pull end stage on the input side. The gate lead of the transistor 24 is connected to the gate lead of the transistor 3, which represents one push-pull input of the push-pull end stage, and the gate lead of the transistor 25 is connected to the gate lead of the transistor 4 which represents the other push-pull input. According to a further feature of the invention, a capacitor 26 is provided between the two aforementioned push-pull inputs. This has the advantage of providing greater stability of the regulating circuit. The output of the further push-pull stage which is formed by the coupled drain leads of the transistors 24 and 25, is connected to the input of a second current mirror referred to the second operating potential 2. The output of the second current mirror is connected to the first operating potential 1, through the drain-to-source path of a PMOS transistor 27. The coupled drain and gate leads of an NMOS transistor 28 which is operated as a diode in the forward direction and leads to the second operating potential 2, are provided as the input of the second current mirror, and the drain lead of an NMOS transistor 29 which is connected on its source side to the second operating potential 2 and on its gate side to the input of the second current mirror, is provided as the output of the second current mirror. The regulating stage of the exemplary embodiment furthermore includes a sample and hold circuit with a storage capacitor 30, which on one hand can be applied through a transmission gate 31 to the output of the second current mirror and on the other is connected both to the first operating potential 1 and to a PMOS transistor 32 acted upon on its source side by the first operating potential 1. In order to change the operating point of the push-pull end stage, the drain-to-source path of the transistor 32 is connected between the gate lead of the transistor 3 and the first operating potential 1. However, the regulating stage only adjusts the static current of one branch of the push-pull end stage, namely the branch having the transistor 3. According to a further feature of the invention, a negative feedback network is, for instance, provided between the output of the push-pull end stage and the inverting input of the amplifier stage, and this network has a resistor 33 connecting the output of the push-pull end stage to the inverting input of the preamplifier stage and a resistor 34 connecting the inverting input to a voltage source 35 referred to the first operating potential 1. The advantage of this embodiment is firstly that less expense is necessary, because no regulating means are needed for the second branch, or in other words the transistor 4 in the exemplary embodiment shown, and secondly, this assures greater stability of the regulating circuit, because two regulating loops are operated counter to one another. Furthermore, according to a further feature of the invention, the reference current flowing into the transistor 27 is dependent on the signal present at the input of the preamplifier stage, in that namely the gate lead of the transistor 27 is likewise connected to the drain lead of the transistor 12. This has the advantageous effect of permitting a level control of the output even with the regulating circuit switched on, and of enabling any disturbance or line trouble to the output to be rapidly compensated for. The triggering of the gate leads of the transmission gate 31 is carried out in phase opposition. One gate lead is therefore triggered directly and the other gate lead is triggered through an inverter 36 by a control signal. The gate side of a PMOS transistor 37 is likewise subjected to the control signal. The source-to-drain path of the transistor 37 is connected parallel to the source-to-drain path of the transistor 27. The advantage of this is that during the time when the transmission gate 31 is blocked, or in other words with the regulation shut off, the drain potential of the transistor 29 is placed at a defined value, namely approximately at the first operating potential 1.

Preferably, the transistor 37 and the transmission gate 31 are triggered in such a way that the switching pulse edges of the two do not overlap. This advantageously precludes short circuiting of the storage capacitor 30 through the transmission gate 31 and the transistor 37 upon transition from the sample phase to the hold phase. A control stage for preventing overlapping switching pulse edges may, for instance, include two NOR gates 38, 39, the outputs of which are each connected firstly through two respective inverters 40, 41 or 42, 43, and secondly to one input of the other respective NOR gate 39 and 38. The other input of the NOR gate 38 is connected directly and the other input of the NOR gate 39 is connected through an inverter 44, to a control input 45. The output of the inverter 41 is carried through an inverter 46 to the gate lead of the transistor 37, while the output of the inverter 43 is connected to a gate lead of the transmission gate 31 and to the input of the inverter 36.

In the amplifier circuit according to the invention, the fluctuations in the static current are kept quite low through the use of a regulating loop having comparatively high amplification, for instance greater than 10. A reference current for the set-point level of the static current is derived through the current mirror being formed of the transistors 12 and 27, from the differential stage of the operational transconductance amplifier having the transistors 20, 10 and 11. The actual level of the current in the transistor 3 is simulated by the transistor 24 and compared through the current mirror being formed of the transistors 28 and 29, with the reference current flowing in the transistor 27. Through the transmission gate 31, the difference between the reference current and a measurement current proportional to the static current controls the transistor 32 acting as a control element or final control element, which sets the static current of the transistor 3 by varying the gate potential of this transistor. In contrast, the static current of the transistor 4, is matched through the negative feedback of the entire amplifier circuit with the resistors 33 and 34. Any difference between the static currents of the transistors 3 and 4 or of the transistors 24 and 25 produces a voltage at the output 5, which acts upon the inverting input of the preamplifier stage through the negative feedback network and thus compensates for the static currents.

By suitable triggering of the transmission gate 31, the static current is only measured in the phases in which the input signal zero is applied and thus only the static current is intended to flow in the push-pull end stage. During the remainder of the time, the corresponding trigger voltage for the transistor 32 is held by the storage capacitor 30. Due to the necessarily different time constants of the inner regulating loop for the static current of the transistor 3 and the outer regulating loop over the entire amplifier circuit for the static current of the transistor 4 for the sake of stability, it is possible that transient faults may be present at the output when the regulation is switched on. In order to minimize these transient disturbances, the downward regulation of the current in the transistor 3 is somewhat retarded, for instance by suitable high-impedance dimensioning of the transfer gate 31 and/or, according a feature of the invention, by clamping the drain lead of the transistor 27 toward the first operating potential 1 as long as the regulating loop is inactive. The ratio between the currents of the transistors 3 and 4 is also used as a second, subordinate control variable. The transistor 25 is used for this purpose.

In order to guarantee the stability of regulation, a compensation with the capacitor 26 between the two push-pull inputs of the push-pull stage is advantageous. These nodes operate in phase opposition with respect to the regulation, so that the effect of the capacitor is increased (Miller effect), while these nodes operate in phase with reference to the signal and thus the speed of the signal path is not affected by the capacitor 26.

In closing it should be noted that an actual embodiment is not limited to MOS technology and bipolar technology or hybrid technologies could also be used.

We claim:

1. Integratable amplifier circuit, comprising a preamplifier stage having an input, a drive stage, a push-pull end stage connected to the drive stage, and a regulating stage connected with the push-pull end stage forming a differential value from a reference current depending on a signal present at said input of said preamplifier stage and from a measurement current proportional to the static current flowing through said push-pull end stage, said regulating stage storing the differential value upon absence of an input signal at a control input at the regulating stage and setting the static current of the push-pull end stage by adjusting the operating point of said push-pull end stage as a function of the stored value.

2. Amplifier circuit according to claim 1, wherein said preamplifier stage has an input, said push-pull end stage has an output and two branches, and said regulating stage sets the static current of one of said branches, and including a negative feedback network connected between said output of said push-pull end stage and said input of said preamplifier stage for setting the static current of the other of said branches.

3. Amplifier circuit according to claim 1, wherein said preamplifier stage is an operational transconductance amplifier.

4. Amplifier circuit according to claim 3, wherein said reference current is generated from the output current of said operational transconductance amplifier.

5. Amplifier circuit according to claim 1, wherein said regulating stage is a sample and hold circuit for storing said differential value.

6. Amplifier circuit according to claim 1, wherein said push-pull end stage has push-pull inputs, and including a capacitor connected between said push-pull inputs.

7. Amplifier circuit according to claim 1, wherein said push-pull end stage has two push-pull inputs, and including a first transistor having a drain lead connected to one of said two push-pull inputs of said push-pull end stage, a source lead connected to a first operating potential, and a gate lead, a storage capacitor connected between said gate and source leads of said first transistor, a push-pull stage having push-pull inputs connected parallel to said push-pull inputs of said push-pull end stage and having an output, a current mirror being referred to a second operating potential and having an input connected to said output of said push-pull stage and an output, a control input, a transmission gate having a drain-to-source path connected between said output of said current mirror and said gate lead of said first transistor and said transmission gate having gate leads being coupled in phase opposition to one another to said control input, and a second transistor having a source lead connected to the first operating potential and a drain lead connected to said output of said current mirror, as a regulating stage.

8. Amplifier circuit according to claim 7, including a third transistor having a drain-to-source path connected parallel to the drain-to-source path of said second transistor and having a gate lead coupled to said control input.

9. Amplifier circuit according to claim 8 including a control stage coupling said gate leads of said transmission gate and said gate lead of said third transistor to said control input, for preventing overlapping switching pulse edges during triggering of said transmission gate and said third transistor.

* * * * *